US006335291B1

(12) United States Patent
Freeman

(10) Patent No.: US 6,335,291 B1
(45) Date of Patent: Jan. 1, 2002

(54) SYSTEM AND METHOD FOR PLASMA ETCH ON A SPHERICAL SHAPED DEVICE

(75) Inventor: Alex Freeman, Plano, TX (US)

(73) Assignee: Ball Semiconductor, Inc., Allen, TX (US)

(*) Notice: Subject to any disclaimer, the term of this patent is extended or adjusted under 35 U.S.C. 154(b) by 0 days.

(21) Appl. No.: 09/448,705

(22) Filed: Nov. 24, 1999

Related U.S. Application Data

(62) Division of application No. 09/350,045, filed on Jul. 8, 1999, now Pat. No. 6,077,388.
(60) Provisional application No. 60/092,343, filed on Jul. 10, 1998.

(51) Int. Cl.[7] .......... H01L 21/3065
(52) U.S. Cl. .......... 438/706; 438/710; 438/712; 438/713
(58) Field of Search .......... 438/706, 710, 438/712; 156/345; 118/723; 257/1, 618

(56) References Cited

U.S. PATENT DOCUMENTS

| | | | | | |
|---|---|---|---|---|---|
| RE31,473 | E | | 12/1983 | Kilby et al. | 425/6 |
| 4,747,922 | A | * | 5/1988 | Sharp | 204/192.11 |
| 5,206,471 | A | * | 4/1993 | Smith | 219/10.55 |
| 5,462,639 | A | | 10/1995 | Matthews et al. | 156/662.1 |
| 5,571,366 | A | | 11/1996 | Ishii et al. | 156/345 |
| 5,955,776 | A | | 9/1999 | Ishikawa | 257/618 |
| 5,961,772 | A | * | 10/1999 | Selwyn | 156/345 |

FOREIGN PATENT DOCUMENTS

| | | |
|---|---|---|
| JP | 2-119241 | 10/1988 |

OTHER PUBLICATIONS

Application No. 09/033,180, filed on Mar. 2, 1998, entitled: Inductively Coupled Plasma Powder Vaporization for Fabricating Integrated Circuits, by Ivan Murzin and Ram Ramamurthi, copy of first page of specification, abstract and figure No. one (Attorney Docket No. 22397.61).

Application No. 09/032,965, filed on Mar. 2, 1998, entitled: Plasma Immersion Ion Processor for Fabricating Semiconductor Integrated Circuits, by Ivan Murzin and Yanwei Zhang, copy of first page of specification, abstract and figure No. one (Attorney Docket No. 22397.62).

Application No. 09/069,645, filed on Apr. 29, 1998, entitled: Plasma–Assisted Metallic Film Deposition, by Changfeng Xia, copy of first page of specification, abstract and figure No. one (Attorney Docket No. 22397.68).

* cited by examiner

*Primary Examiner*—Benjamin L. Utech
*Assistant Examiner*—Lan Vinh
(74) *Attorney, Agent, or Firm*—Haynes and Boone, LLP

(57) ABSTRACT

A system and method for performing plasma etch on a spherical shaped device is disclosed. The system includes a processing tube for providing a reactive chamber for the spherical shaped substrate and a plasma jet is located adjacent to the processing tube. The plasma jet includes a pair of electrodes, such as a central cathode and a surrounding anode, for producing a plasma flame directed towards the reactive chamber. The central cathode may, for example, be powered by a radio frequency power source. As a result, the reactive chamber supports non-contact etching of the spherical shaped substrate by the plasma flame.

10 Claims, 1 Drawing Sheet

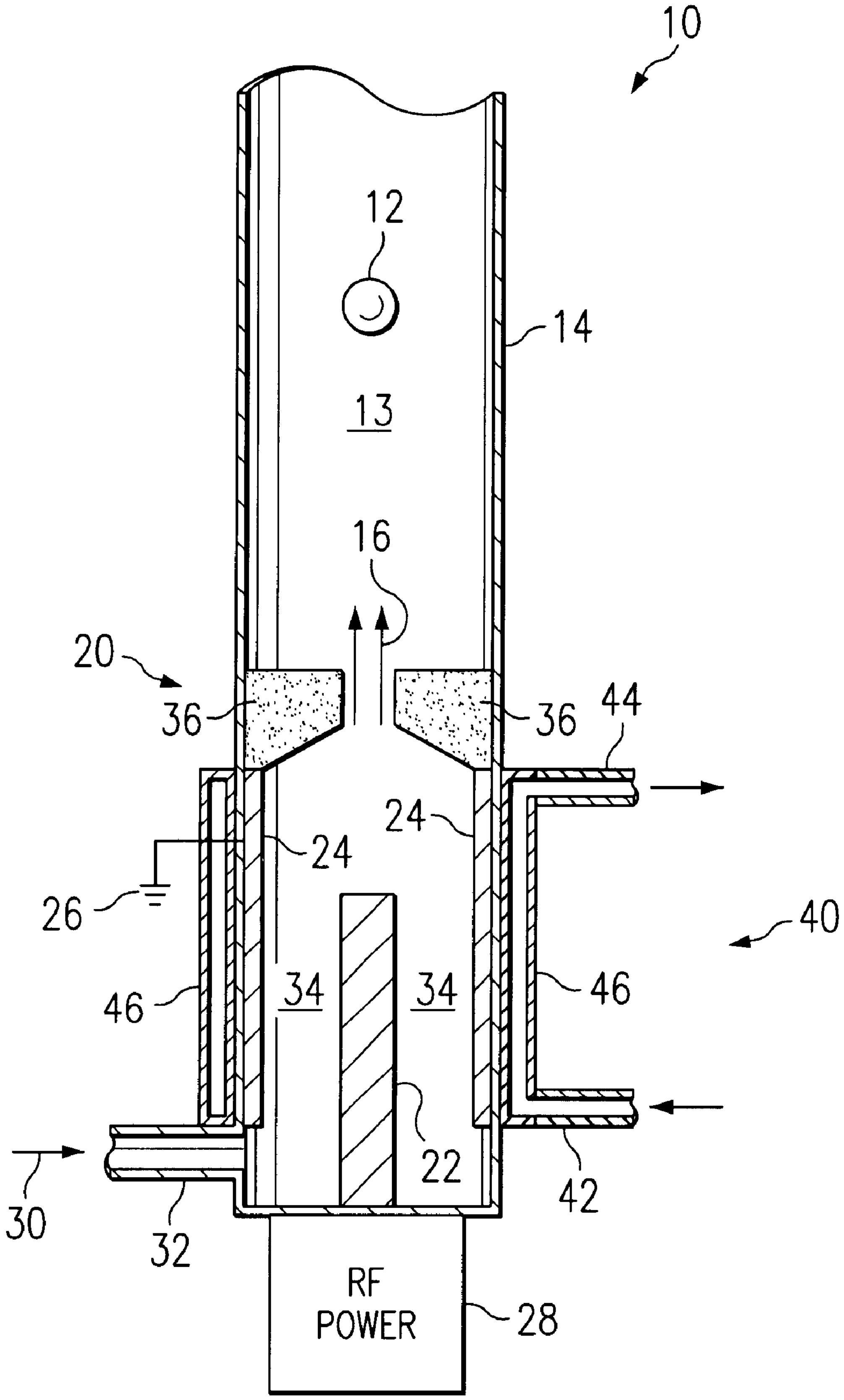
10
12
14
13
16
20
36
36
44
24
24
26
40
46
34
34
46
22
30
32
42
RF
POWER
28

SYSTEM AND METHOD FOR PLASMA ETCH ON A SPHERICAL SHAPED DEVICE

CROSS REFERENCE

This patent is a divisional of U.S. Ser. No. 09/350.045 filed Jul. 8, 1999, which claims the benefit of U.S. Ser. No. 60/092,343 filed Jul. 10, 1998.

BACKGROUND OF THE INVENTION

The invention relates generally to semiconductor integrated circuits, and more particularly, to an apparatus and method for etching a semiconductor integrated circuit such as on a spherical-shaped semiconductor device.

Conventional integrated circuit devices, or "chips," are formed from a flat surface semiconductor wafer. The semiconductor wafer is first manufactured in a semiconductor material manufacturing facility and is then provided to a fabrication facility. At the latter facility, several processing operations are performed on the semiconductor wafer surface.

One common processing operation is etching. Conventionally, whole wafers are completely coated with a layer or layers of various materials such as silicon nitride, silicon dioxide, or a metal. The unwanted material is then selectively removed by etching through a mask, thereby leaving, for example, selectively removed by etching through a mask, thereby leaving, for example, various patterns and holes in a thermal oxide where diffusions are to be made. For another example, etching can be used to create long stripes of aluminum for electrical interconnects between individual circuit elements. In addition, various patterns must sometimes be etched directly into the semiconductor surface. Examples include: circular holes or short grooves where trench capacitors are to be made in silicon; mesas that are required in the silicon dielectric isolation process; and small, flat depressions in GaAs where the gate metal is to be deposited.

While most etching processes use a mask, a few procedures do not involve any local masking. These procedures include etching whole semiconductor slices to remove damage and/or to polish the surface, and etching slices or chips to delineate crystallographic defects. In addition, before the advent of planar technology, a variety of germanium and silicon etching steps were used for removing damage from junctions.

There are many different kinds of etching processes. One such type is plasma etching. Plasma etching, and combination plasma/reactive ion etching, are performed in a low-pressure gaseous plasma, and are most commonly used in fine-geometry applications. Plasma etching generally involves fewer safety hazards and spent chemical disposal problems, but the additional cost of plasma equipment is a deterrent to its use when fine-line definition is not necessary.

In U.S. Pat. No. 5,995,776 filed on May 16, 1997, a method and apparatus for manufacturing spherical-shaped semiconductor integrated circuit devices is disclosed. It is desired to provide an apparatus and method for performing plasma etching process on a spherical-shaped device to create the integrated circuit thereon.

SUMMARY

Provided herein is a system and method for performing plasma etch on a spherical shaped device. In one embodiment, the system includes a processing tube for providing a reactive chamber for the spherical shaped substrate. A plasma jet is located adjacent to the processing tube. The plasma jet includes a pair of electrodes, such as a central cathode and a surrounding anode, for producing a plasma flame directed towards the reactive chamber. The central cathode may, for example, be powered by a radio frequency power source. As a result, the reactive chamber supports non-contact etching of the spherical shaped substrate by the plasma flame from the plasma jet.

In some embodiments, the system also includes a cooling system for cooling at least a portion of the plasma jet.

In some embodiments, the plasma jet includes a directional nozzle for directing the plasma flame towards a central portion of the reactive chamber.

BRIEF DESCRIPTION OF THE DRAWINGS

The figure describes a system and method for etching a spherical shaped integrated circuit device according to one embodiment of the invention.

DESCRIPTION OF THE PREFERRED EMBODIMENT

The following disclosure provides many different embodiments, or examples, for implementing different features. Techniques and requirements that are only specific to certain embodiments should not be imported into other embodiments. Also, specific examples of processing gases and component shapes and arrangements are described below to simplify the present disclosure. These are, of course, merely examples and are not intended to limit the invention from that described in the claims.

Referring to the figure, the reference numeral 10 designates, in general, a system for etching a device, such as a spherical-shaped semiconductor integrated circuit device 12. For the sake of example, the device 12 could be of the same type formed according to the technique disclosed in the above-identified U.S. Pat. No. 5,955,776.

The device 12 moves through an inner chamber 13 of a processing tube 14 with a carrier gas (not shown). The device 12 may move according to a pipeline process flow from one processing station to another, such that the system 10 is merely one processing operation in a series of operations. The device 12 eventually resides near a central portion of the inner chamber 13, without contacting the processing tube 14.

The device 12 may, in some embodiments, be carried and/or levitated by a plasma flame 16 inside the chamber 13. Furthermore, the device 12 may be rotated by the plasma flame and/or the carrier gas to facilitate processing operations. For example, the plasma flame 16 may provide an upward force, as seen in the figure, to the device 12 to counteract a downward force of the device due to gravity.

The system 10 includes an atmospheric pressure plasma jet, designated generally by the reference numeral 20. The plasma jet 20 produces the uniform low-temperature plasma flame 16 at about 100–275° C. for materials processing on the device 12. The plasma jet 20 includes two coaxial electrodes: a center cathode 22 and a surrounding anode 24. The surrounding anode 24, in the present embodiment, is attached to a grounded power supply 26. The center cathode 22 is coupled to a radio frequency ("RF") source 28 operating at 13.56 MHZ frequency and between 40–500 Watts of RF power. Process gases 30 are injected into the processor 10 through an inlet 32, where the plasma jet heats the gas.

For the sake of example, the process gases 30 may include helium, oxygen and carbon tetrafluoride, which are fed into an annular space 34 between the two electrodes 22, 24. Responsive to the power created between the electrodes 22, 24, the process gases 30 form the plasma flame 16, which is directed towards the chamber 13 through a nozzle portion 36. The nozzle portion 36 serves to direct the plasma flame 16 towards a central portion of the chamber 13, and specifically, towards the device 12.

Any direct current ("DC") voltage between the plasma flame 16 and either electrode 22, 24 is the same and relatively small. The various ions and free radicals that are generated in the plasma flame 16 diffuse to the electrode 22, 24 and device 12 surfaces, where they can react with the material being etched to form volatile products that are pumped away.

A cooling system 40 is also provided with the system 10. The cooling system, in the present embodiment, includes a water inlet 42, a water outlet 44, and a cooling sleeve 46. The cooling sleeve 46 wraps around and surrounds the anode 24. It is understood, however, that different cooling arrangements and cooling fluids can be used for different embodiments, as necessary.

It is understood that several variations may be made in the foregoing. For example, different shaped devices can be etched in the above-described system. Additional modifications, changes and substitutions are intended in the foregoing disclosure and in some instances some features of the invention will be employed without a corresponding use of other features. Accordingly, it is appropriate that the appended claims be construed broadly and in a manner consistent with the scope of the invention.

I claim:

1. A method for etching a substrate in a non-contact environment, the method comprising:

providing a reactive chamber for the substrate;

converting the processing gas into a plasma flame;

directing the plasma flame towards a central portion of the reactive chamber;

levitating and rotating the substrate in a central portion of the reactive chamber without contacting the processing tube; and processing the substrate with the plasma flame.

2. The method of claim 1 further comprising:

receiving a processing gas into an adjacent chamber;

providing the processing gas to the reactive chamber while the substrate is levitating inside the central portion of the reactive chamber.

3. The method of claim 1 wherein the substrate is rotated by a force exerted by the plasma flame.

4. The method of claim 1 wherein the substrate is levitated by force exerted by the plasma flame.

5. The method of claim 4 wherein the force exerted by the plasma flame is in direct opposition to a gravitational force being applied to the substrate.

6. A method for etching a spherical shaped substrate, the method comprising:

providing a reactive chamber for receiving the spherical shaped substrate without contacting the substrate;

producing a plasma flame with a pair of electrodes; and directing the plasma flame towards the reactive chamber; and supporting the spherical shaped substrate inside the reactive chamber with the plasma flame; and spinning the spherical shaped substrate with the plasma flame while the spherical shaped substrate is being supported in the reactive chamber.

7. The method of claim 6 further comprising:

cooling an area surrounding the plasma flame.

8. The method of claim 6 wherein the plasma is directed towards a central portion of the reactive chamber.

9. The method of claim 6 further comprising:

providing a radio frequency power to one of the electrodes.

10. The method of claim 6 further comprising:

providing reactive gas to an area between the electrodes for use in producing the plasma flame.

* * * * *